(12) United States Patent
Johnson et al.

(10) Patent No.: US 8,000,374 B2
(45) Date of Patent: Aug. 16, 2011

(54) SURFACE GRATINGS ON VCSELS FOR POLARIZATION PINNING

(75) Inventors: Ralph H. Johnson, Murphy, TX (US); James K. Guenter, Garland, TX (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 11/299,638

(22) Filed: Dec. 12, 2005

(65) Prior Publication Data

US 2006/0239325 A1 Oct. 26, 2006

Related U.S. Application Data

(60) Provisional application No. 60/673,219, filed on Apr. 20, 2005, provisional application No. 60/711,311, filed on Aug. 25, 2005.

(51) Int. Cl.
*H01S 3/08* (2006.01)
*H01S 5/00* (2006.01)

(52) U.S. Cl. .................. 372/102; 372/99; 372/50.11

(58) Field of Classification Search .............. 372/102, 372/99, 50.11
See application file for complete search history.

(56) References Cited

U.S. PATENT DOCUMENTS

| | | | |
|---|---|---|---|
| 5,724,376 A * | 3/1998 | Kish et al. | 372/96 |
| 6,055,262 A | 4/2000 | Cox et al. | |
| 6,937,638 B2 | 8/2005 | Fish et al. | |
| 7,689,086 B2 * | 3/2010 | Magnusson et al. | 385/129 |
| 2002/0176463 A1 * | 11/2002 | Bullington et al. | 372/45 |
| 2003/0034538 A1 * | 2/2003 | Brophy et al. | 257/444 |
| 2004/0258119 A1 * | 12/2004 | Shams-Zadeh-Amiri et al. | 372/45 |
| 2005/0135453 A1 * | 6/2005 | Kneissl et al. | 372/94 |
| 2005/0158902 A1 | 7/2005 | Chua et al. | |
| 2005/0169343 A1 * | 8/2005 | Ostermann et al. | 372/98 |

FOREIGN PATENT DOCUMENTS

| | | |
|---|---|---|
| CA | 02487758 | 11/2004 |
| DE | 10353951 | 6/2005 |
| WO | 94/13043 | 6/1994 |

OTHER PUBLICATIONS

Polarization Behavior and Mode Structure of Elliptical Surface Relief VCSELs, Miren Camarena, et al., in Proc. Conf. on Lasers and Electro Optics Europe, CLEO-Europe 2003, Munich, Germany, Jun. 2003 IEEE.

Polarization-Controlled 850-nm-Wavelength Vertical-Cavity Surface-Emitting Lasers Grown on (311)B Substrates by Metal-Organic Chemical Vapor Deposition, Hiroyuki Uenohara, et al., IEEE Journal of Selected Topics in Quantum Electronics, vol. 5, No. 3, May/Jun. 1999, pp. 537-545.

(Continued)

*Primary Examiner* — Minsun Harvey
*Assistant Examiner* — Patrick Stafford
(74) *Attorney, Agent, or Firm* — Maschoff Gilmore & Israelsen

(57) ABSTRACT

A polarization pinned vertical cavity surface emitting laser (VCSEL). A VCSEL designed to be polarization pinned includes an upper mirror. An active region is connected on the upper mirror. A lower mirror is connected to the active region. A grating layer is deposited to the upper mirror. The grating layer includes a low index of refraction layer formed by deposition on the upper mirror. The grating layer further includes a high index of refraction layer formed by deposition on the low index of refraction layer. A grating is formed into the grating layer.

18 Claims, 2 Drawing Sheets

OTHER PUBLICATIONS

An 850-nm InAlGaAs Strained Quantum-Well Vertical-Cavity Surface-Emitting Laser Grown on GaAs (311)B Substrate with High-Polarization Stability, Osamu Tadanaga, et al., IEEE Photonics Technology Letters, vol. 12, No. 8, Aug. 2000, pp. 942-944.
VCSEL Polarization Control by Optical Injection, S. Bandyopadhyay, et al., Journal of Lightwave Technology, vol. 21, No. 10, Oct. 2003, pp. 2395-2404.
Single-Mode, Single-Polarization VCSELs via Elliptical Surface Etching: Experiments and Theory, Pierluigi Debernardi, et al., IEEE Journal of Selected Topics in Quantum Electronics, vol. 9, No. 5, Sep./Oct. 2003, pp. 1394-1404.
CW and Dynamic Stable Polarized Light Emission from VCSELs Grown on (311)B Substrate by MOCVD, H. Uenohara, et al., Oct. 1998 IEEE, pp. 235-236.
A Highly Strained ($\lambda$=1.12 μm) GaInAs/GaAs VCSEL on GaAs (311)B Substrate Exhibiting Stable Polarization, N. Nishiyama, et al., Sep. 2000 IEEE, pp. 11-12.
Asymmetric Current Injection for Polarization Stabilization in Vertical-Cavity Surface-Emitting Lasers, G. Verschaffelt, et al., Jul. 1999 IEEE, pp. 47-48.
Lasing Characteristics of InGaAs-GaAs Polarization Controlled Vertical-Cavity Suface-Emitting Laser Grown on GaAs (311) B Substrate, Nobuhiko Nishiyama, et al., IEEE Journal of Selected Topics in Quantum Electronics, vol. 5, No. 3, May/Jun. 1999, pp. 530-536.
Stable Linearly Polarized Light Emission from VCSELs with Oxidized Elliptical Current Aperture, U. Fiedler, et al., Oct. 1996 pp. 19-20.
Design and Modeling of Polarization-Stable Surface-Etched VCSELs, H.J. Unold, et al., Sep./Oct. 2002 IEEE, pp. 15-16.
Thursday Afternoon/CLEO'99, Thursday, May 27, pp. 483-484.
Lasing Characteristics of GaAs (311)A Substrate Based InGaAs-GaAs Vertical-Cavity Surface-Emitting Lasers, Mitsuo Takahashi, et al., IEEE Journal of Selected Topics in Quantum Electronics, vol. 3, No. 2, Apr. 1997, pp. 372-378.
Realization of polarization-reconfigurable optical interconnections using VCSELs and polarization selective diffractive optical elements, A. Goulet, et al., Jun. 1999 IEEE, pp. 7-8.
Controlled Polarization Switching in VCSELs by Means of Asymmetric Current Injection, L.M. Augustin, et al., IEEE Photonics Technology Letters, vol. 16, No. 3, Mar. 2004, pp. 708-710.
Polarization Stabilization in Vertical-Cavity Surface-Emitting Lasers Through Asymmetric Current Injection, G. Verschaffelt, et al., IEEE Photonics Technology Letters, vol. 12, No. 8., Aug. 2000, pp. 945-947.
Optical feedback control of polarization switching in vertical-cavity surface-emitting lasers, Yanhua Hong, et al., 2004 IEEE, pp. 51-52.
Highly Strained GaInAs-GaAs Quantum-Well Vertical-Cavity Surface-Emitting Laser on GaAs (311)B Substrate for Stable Polarization Operation, IEEE Journal on Selected Topics in Quantum Electronics, vol. 7, No. 2, Mar./Apr. 2001, pp. 242-248.
Dynamically Stable Polarization Characteristics of Oxide-Confinement Vertical-Cavity Surface-Emitting Lasers Grown on GaAs(311)A Substrate, M. Takahashi, et al., Aug. 1997, pp. 35-36.
Thursday Morning/QELS'96, pp. 171-173.
Coupled Mode Theory: A Powerful Tool for Analyzing Complex VCSELs and Designing Advanced Device Features, Pierluigi Debernardi, et al., IEEE Journal of Selected Topics in Quantum Electronics, vol. 9, No. 3, May/Jun. 2003, pp. 905-917.
Coupled-Mode Theory for Guided-Wave Optics, Amnon Yariv, IEEE Journal of Quantum Electronics, vol. QE-9, No. 9, Sep. 1973, pp. 919-933.
Rigorous coupled-wave analysis of planar-grating diffraction, M.G. Moharam, et al., vol. 71, No. 7/Jul. 1981/J. Optical Society of America, pp. 811-818.
Shallow Surface Gratings for High-Power VCSELs With One Preferred Polarization for all Modes, Johannes Michael Ostermann, et al., IEEE Photonics Technology Letters, vol. 17, No. 8, Aug. 2005, pp. 1593-1595.
Submicrometer periodicity gratings as artificial anisotropic dielectrics; Dale C. Flanders, Lincoln Laboratory, Massachusetts Institute of Technology, Received Dec. 13, 1982; accepted for publication Jan. 5, 1983, pp. 492-494.
Effective medium theory of two-dimensional subwavelength gratings in the non-quasi-static limit, Hisao Kikuta, et al., vol. 15, No. 6/Jun. 1998, Optical Society of America, pp. 1577-1585.
The Effect of Intervalence Band Absorption on the Thermal Behavior of InGaAsP Lasers, Charles H. Henry, et al., IEEE Journal of Quantum Electronics, vol. QE-19, No. 6, Jun. 1983, pp. 947-952.
Analysis and Applications of Optical Diffraction by Gratings, Thomas K. Gaylord, et al., Proceedings of the IEEE, vol. 73, No. 5, May 1985, pp. 894-937.
Guided-mode grating resonant filters for VCSEL applications, J.A. Cox, et al:, SPIE vol. 3291, Jan. 28-29, 1998, pp. 70-76.
Theory and applications of guided-mode resonance filters, S.S. Wang, et al., Applied Optics/ vol. 32, No. 14, May 10, 1993, pp. 2606-2613.
Analysis of surface relief diffraction gratings made of anisotropic material, Optical and Quantum Electronics 31, Sergio Bastonero, et al., Feb. 8, 1999, pp. 943-955.
High Single-Mode Power, Monolithic Polarization Controlled Oxide-Confined Grating Relief VCSELs, Johannes Michael Ostermann, et al., Sep. 2004 IEEE, pp. 109-110.
Reliable Polarization Control of VCSELs Through Monolithically Integrated Surface Gratings: A Comparative Theoretical and Experimental Study, Pierlugi Debernardi, et al., IEEE Journal of Selected Topics in Quantum Electronics, vol. 11, No. 1, Jan./Feb. 2005, pp. 107-116.
Monolithic polarization control of multimode VCSELs by a dielectric surface grating, Johannes Michael Ostermann, et al., SPIE, Bellingham, WA, 2004, Proc. of SPIE vol. 5364, pp. 201-212.
Office Action, DE 112006 003 384.0-54, Feb. 17, 2010.
Office Action, CN 200680046769.0, Jan. 22, 2010.
Office Action, TW095142716, May 26, 2009.
Office Action, TW095142716, Sep. 14, 2009.

* cited by examiner

SURFACE GRATINGS ON VCSELS FOR POLARIZATION PINNING

This application claims priority to U.S. Provisional Applications No. 60/673,219 titled "Integrated VCSEL and Photodiode with Asymmetries for Polarization Control" filed Apr. 20, 2005 and Ser. No. 60/711,311 titled "Amorphous Silicon Gratings for Polarization Control" filed Aug. 25, 2005, which are incorporated herein by reference in their entireties.

BACKGROUND OF THE INVENTION

1. The Field of the Invention

The invention generally relates to polarization control in VCSELs. More specifically, the invention relates to using gratings for polarization control.

2. Description of the Related Art

Lasers have become useful devices with applications ranging from simple laser pointers that output a laser beam for directing attention, to high-speed modulated lasers useful for transmitting high-speed digital data over long distances. Several different types of lasers exist and find usefulness in applications at the present time. One type of laser is the edge emitter laser which is formed by cleaving a diode from a semiconductor wafer. Cleaving a diode from a semiconductor wafer forms mirrors that form a laser cavity defined by the edges of the laser diode. Edge emitter lasers may be designed to emit a laser beam more strongly from one of the edges than the other edges. However, some laser energy will be emitted at the other edges. Edge emitter lasers are commonly used when high optical power is needed.

A second type of commonly used laser is known as a vertical cavity surface emitting laser (VCSEL). A VCSEL is formed in part by forming a first mirror from Distributed Bragg Reflector (DBR) semiconductor layers. The DBR layers alternate high and low refractive indices so as to create the mirror effect. An active layer is then formed on the first mirror. A second mirror is formed on the active layer using more DBR semiconductor layers. Thus the VCSEL laser cavity is defined by upper and lower mirrors which causes a laser beam to be emitted from the surface of the laser.

One challenge that exists with the VCSELs mentioned above relates to polarization of optical beams. For example, in communication circuits, if polarized light is emitted from a laser device, the light can be routed using various types of beam splitters and polarization selective filters. However, often polarization in a VCSEL will change from batch to batch and depending on the operating conditions under which the VCSEL is operating. For example, a VCSEL may have one polarization at a given bias current and another polarization at a different bias current. In sensor applications, it is often important to emit a constant polarization because part of the sensing operation relates to detecting differences in polarization. Thus, it would be advantageous to effectively pin polarization in VCSELs.

BRIEF SUMMARY OF THE INVENTION

One embodiment described herein includes a polarization pinned vertical cavity surface emitting laser (VCSEL). The VCSEL is includes an upper mirror. An active region is connected to the upper mirror. A lower mirror is connected to the active region. A grating layer is deposited on the upper mirror. The grating layer includes a low index of refraction layer formed by deposition on the upper mirror. The grating layer further includes a high index of refraction layer formed by deposition on the low index of refraction layer. A grating is formed into the grating layer.

Another embodiment described herein includes an alternative embodiment of a polarization pinned VCSEL. The VCSEL includes an upper mirror. An active region is connected to the upper mirror. A lower mirror is connected to the active region. A grating layer is deposited on the upper mirror. A grating is formed into the grating layer. The grating layer has a duty cycle below 50%.

Yet another embodiment includes a method for manufacturing a polarization pinned VCSEL. The method includes growing a lower mirror on a substrate. An active region is grown on the lower mirror. An upper mirror is grown on the active region. A grating layer is deposited on the upper mirror. A grating is etched into the grating layer.

Advantageously, the embodiments described above allow for polarization pinned VCSELs to be manufactured. This allows the VCSELs to be used in communication and sensor circuits where un-polarized VCSELs were previously not available for use.

These and other features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Light from optical components can be described as polarized or un-polarized. Un-polarized light can more accurately be characterized as light of a random polarization. Light may be emitted randomly from a device, such as a VCSEL, in any one of an infinite number of polarizations. The polarization can be characterized by X and Y vectors or by a magnitude and angle describing the direction of the electric field, generally perpendicular to the direction of propagation, i.e. Z. In some cases, the light may be circularly polarized which may be characterized by changing X and Y values as the light propagates. If light can be facilitated in one direction, while it is inhibited in an orthogonal direction, polarized light can be produced where all, or at least for the most part, light is emitted in a single known polarization direction. On Zinc Blende substrates such as GaAs on or about 100 orientation, there are two polarization directions, namely along the (011) and (01-1) directions. These are normally along and perpendicular respectively to the major flat. Using asymmetries, light emissions can be facilitated in one direction while they are inhibited in the orthogonal direction. Exploiting asymmetries and gratings may be used to pin polarization in a VCSEL.

Figure 1:
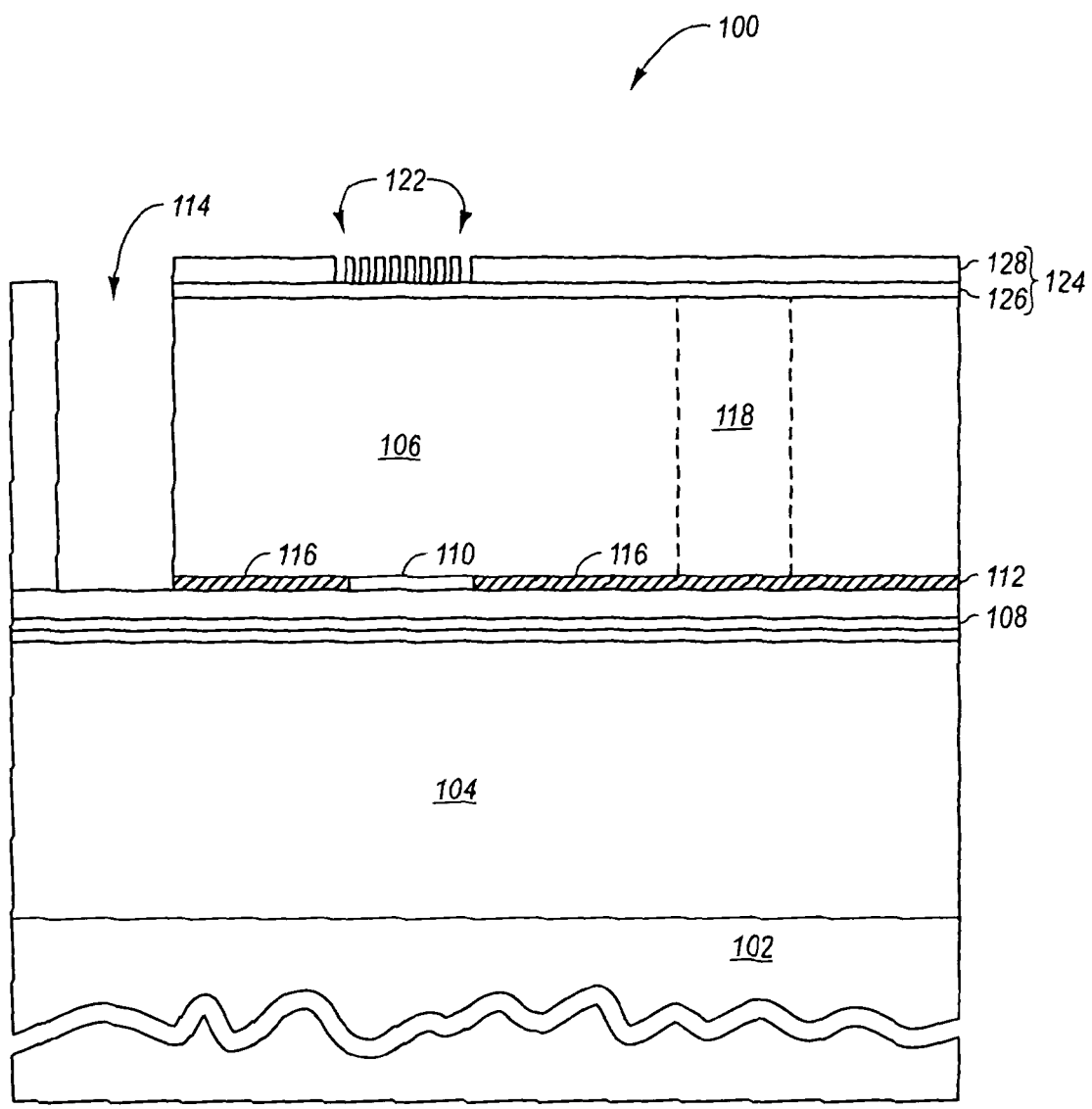
FIG. 1 illustrates a cutaway view of a VCSEL and grating.

Referring now to FIG. 1, a cutaway view of a VCSEL structure is illustrated. The VCSEL 100 is formed from an epitaxial structure. The epitaxial structure may include, for example, various layers formed through a process such as molecular beam epitaxy (MBE) or other appropriate method. The example shown in FIG. 1 illustrates a GaAs substrate 102. The VCSEL 100 includes a lasing cavity formed by a lower mirror 104 and an upper mirror 106. A lower mirror 104 is grown on the substrate 102. The lower mirror 104, in this example includes alternating layers of higher and lower index of refraction materials. Each interface between higher and lower index of refraction materials causes reflection. Thus by using an appropriate number of alternating layers, a given reflectivity can be achieved.

An upper mirror 106 is grown on an active region 108. The upper mirror 106 is similar to the lower mirror 104 in that it generally comprises a number of layers that alternate between a high index of refraction and a lower index of refraction. Generally, the upper mirror 106 has fewer mirror periods of alternating high index and low index of refraction layers, to enhance light emission from the top of the VCSEL 100.

Between the mirrors 104, 106 is an active region 108 that includes quantum wells. The active region 108 forms a PN junction sandwiched between the lower mirror 104 and an upper mirror 106, which are doped such that they are of opposite conductivity types (i.e. a p-type mirror and an n-type mirror). In alternative embodiments, the mirrors may be undoped or the mirrors may be dielectric mirrors. Free carriers in the form of holes and electrons are injected into the quantum wells when the PN junction is forward biased by an electrical current. At a sufficiently high bias current the injected minority carriers form a population inversion (i.e. a higher concentration of free carriers in the conduction band than electrons in the valance band) in the quantum wells that produces optical gain. Optical gain occurs when photons in the active region cause electrons to move from the conduction band to the valance band which produces additional photons. When the optical gain is equal-to the loss in the two mirrors, laser oscillation occurs. The free carrier electrons in the conduction band quantum well are stimulated by photons to recombine with free carrier holes in the valence band quantum well. This process results in the stimulated emission of photons, i.e. coherent light.

The active region 108 may also include or be formed near an oxide aperture 110 formed using one or more oxide layers 112. The oxide aperture 110 serves both to form an optical cavity and to direct the bias current through the central region of the cavity that is formed. To form the oxide aperture 110, a trench 114 is etched down to the oxide layer 112 to expose the oxide layer 112. An oxide 116 is then grown by subjecting the exposed oxide layer 112 to various chemicals and conditions so as to cause portions of the oxide layer 112 to oxidize. The oxidized portion 116 becomes optically lower in index of refraction and electrically insulating so as to form the boundaries of the oxide aperture 110.

As illustrated in FIG. 1, a grating 122 may be included in a grating layer 124 on the VCSEL 100 to control polarization. The grating 122 may be formed over the oxide aperture 110 so as to provide the polarizing effect to light emitted from the oxide aperture 110. In the example shown, a low index of refraction layer 126 is formed through a deposition process on a high index of refraction layer of the top mirror 106. A high index of refraction layer 128 is formed through a deposition process on the low index of refraction layer 126. The grating 122 is then formed into the high index of refraction layer 128 or alternatively into both the high index of refraction layer 128 and a portion of the low index of refraction layer 126. In one embodiment where the grating 122 is formed only into the high index of refraction layer 128, the low index of refraction layer 126 may be used as an etch stop layer for etching the grating 122 into the high index of refraction layer 128.

In one embodiment, the high index of refraction layer 128 and low index of refraction layer 126 are thin layers as thin layers seem to exhibit better polarization and optical transmission characteristics. The high index of refraction layer 128 may be for example Si or $Si_3N_4$. The low index of refraction layer 126 may be for example $SiO_2$. The index of refraction for the low index of refraction layer 126 may be for example between 1.2 and 2.5. The index of refraction for the high index of refraction layer 128 may be for example between 1.8 and 5. In any case, the high index of refraction layer 128 has, in one embodiment, an index of refraction that is 0.3 or greater than the index of refraction for the low index of refraction layer 126.

The gratings 122 are designed to maximize the reflection of the desired polarization and to minimize the reflectivity of the perpendicular polarization so the VCSEL 100 will lase in the polarization of highest reflectivity and be inhibited from lasing in the perpendicular direction. VCSELs prefer to lase with polarizations in the (110) planes, so it may be advantageous to select one of the desired directions, although this is not required.

Figure 2:
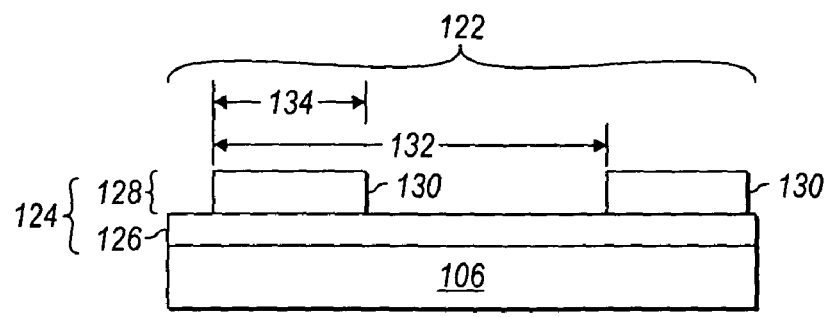
FIG. 2 illustrates a detailed view of a VCSEL grating.

FIG. 2 illustrates a more detailed view of the gratings 122 used for polarization control. FIG. 2 illustrates a grating 122 that includes a number of protrusions 130. The protrusions 130 may be etched into the high index of refraction layer 128 which may be, for example, comprised of Si or $Si_3N_4$.

To form the grating 122, the low index of refraction layer 126 and high index of refraction layer 128 are deposited, as opposed to grown as is typically done with the mirror layers in the top mirror 106 and bottom mirror 104, on a high index of refraction layer of the top mirror 106 of the VCSEL 100 (FIG. 1). This can be done, for example, (PECVD (plasma enhanced vapor deposition), by sputtering or evaporation at a reasonably low substrate temperature. The low index of refraction layer 126 and high index of refraction layer 128 may be thin layers. The following is described with thicknesses described in terms of optical thicknesses such that one wave thickness is the thickness of a full wave in that material. For example silicon nitride has an index of refraction of about 2 at 850 nm. A wave of silicon nitride is therefore 850 nm/2.0 or 425 nm. In some embodiments, the low index of refraction layer 126 may have a wave optical thickness of between 0.04 and 0.18. An optical thickness of about 0.1 wavelengths for the low index of refraction layer 126 functions well in one embodiment. The high index of refraction layer 128 may be, in some embodiments, between 0.15 and 0.5 wavelengths thick. A thickness of about 0.25 wavelengths seems to function well in one exemplary embodiment. The combined thickness of the low index of refraction layer 126 and high index of refraction layer may be, in one embodiment, 0.25 waves thick. This may be done to create a low reflectivity region outside the grating where it is not etched to provide mode control. Examples of this are illustrated in U.S. Pat. No. 5,940,422, titled "Laser With Improved Mode Control" which is incorporated herein by reference in its entirety.

The high index of refraction layer 128 is then etched using in one embodiment direct write electron beam lithography. Direct write electron beam lithography involves depositing an electron beam resist layer on a surface to be etched. An electron beam is then used to expose the resist. The electron beam can be controlled in much the same way as electrons in a conventional cathode ray tube television are controlled. The electron beam is used to pattern a region that will be etched leaving the protrusions 130. A reactive ion etch (RIE) or other appropriate etch is then used to etch portions of the high index of refraction layer 128 to produce the grating 122. In one embodiment, a stop etch may be used that selectively etches the high index of refraction layer, but stops on the low index of refraction layer 126. In this embodiment, the high index layer 128 may be $Si_3N_4$, and low index layer 126 may be $SiO_2$.

The protrusions 130 are formed periodically. For example, the protrusions may be formed according to a period 132. The period may be for example in the rage of about 1 to 2 wavelengths of the laser as measured in air. This period allows for low cost photolithography while maintaining adequate discrimination between the two competing orthogonal polarizations.

The protrusions 130 may also be etched according to a particular duty cycle. The duty cycle is the width 134 of the protrusions with respect to a period 132. The duty cycle should be less than 50% although above 50% still functions. In particular, the duty cycle may be anywhere from 10% to 60%. One embodiment functions particularly well with a 30% duty cycle.

Various alternatives embodiments will now be described in conjunction with FIG. 2. It may be preferable to use thin layers for the high index of refraction layer 128 and low index of refraction layer 126. For example, in one embodiment illustrating an 850 nm VCSEL, the low index of refraction layer 126 may comprise 70 nm of $SiO_2$. The high index of refraction layer 128 may comprise a 100 nm layer of $Si_3N_4$. The period 132 of the protrusions 130 may be for example between 1 and 2 microns. It may be advantageous to maximize the period for ease of fabrication. While the period 132 is illustrated at 1 to 2 microns, other values may also be used. However, at about 750 nm, due to resonance, the loss factor, a measure of loss of one polarization with respect to the orthogonal polarization, exhibited suggests that periods about this value should be avoided. Even in the 1 to 2 micron range, another resonance is exhibited at about 1690 nm. However, the loss factor still remains significant. At a 1690 nm period 132, there may be some loss of reflectivity of the higher reflected polarization. This can be compensated for by adding more DBR periods in the top mirror 106.

In the example shown in FIG. 2 where the VCSEL is an 850 nm VCSEL, the duty cycle of the protrusions 130 may be about 30%. In other words the width 134 of the protrusion 130 is 30% of the period 132. Other duty cycles may be used successfully, such as between 10% and 60%. However below 50%, and at about 30% appears to be at or near the optimal duty cycle value.

For a 1280 nm VCSEL, the low index of refraction layer 126 may be 65 nm of $SiO_2$. The high index of refraction layer 128 may be 220 nm of $Si_3N_4$. The period 132 may be about 1.3 to 2.4 microns. In the 1280 nm case, resonance may occur at a 1280 nm period 132 and as such, periods of about this value should be avoided. The period 132 may be for example between 1600 nm and 2300 nm. While other periods may be used, periods below 850 nm become difficult to print using the etching process. Above 2400 nm, the reflectance difference between the two orthogonal polarizations weakens, making polarization more difficult to achieve.

In an alternative embodiment of an 850 nm VCSEL, the low index of refraction layer 126 may be 40 nm of $SiO_2$. The high index of refraction layer 128 may be 75 nm of Si. In this example the period 132 is still about 1 to 2 microns and the duty cycle is about 30%.

In the example shown in FIG. 2 the low index of refraction layer 126 may also be used as passivation for the VCSEL 100 (FIG. 1). Typically, III-V semiconductors such as GaAs and AlGaAs can degrade when exposed to open air. By passivating the semiconductor materials with a layer such as $SiO_2$, the degradation can be slowed or prevented altogether. Thus, when the low index of refraction layer 126 is also used as an etch stop layer in the grating formation etch process, the low index of refraction layer 126 may be used as passivation for the VCSEL 100 (FIG. 1).

Figure 3:
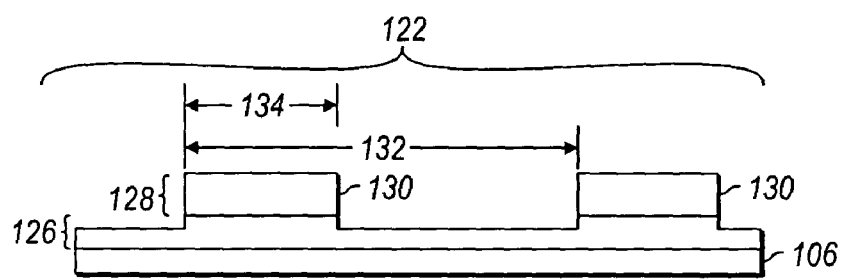
FIG. 3 illustrates another detailed view of a VCSEL grating.

Referring now to FIG. 3, an alternative embodiment of an 850 nm VCSEL grating 122 is illustrated. In the example shown in FIG. 3, the low index of refraction layer 126 is about 70 nm of $SiO_2$ and the high index of refraction layer 128 is about 100 nm of $Si_3N_4$. In this example etching of the protrusions 130 is performed using a timed etch system where the etchant etches into both the high index of refraction layer 128 and low index of refraction layer 126. In the embodiment shown in FIG. 3, etching is done such that about 50 nm of the low index of refraction layer 126 remains on the VCSEL top mirror 106. This 50 nm layer may function as passivation protection for the VCSEL top mirror 106. As with the examples previously illustrated herein, the period is about 1 to 2 microns. Also, the duty cycle, or the width of the protrusion 134 as compared to the period 132, is about 30%.

Figure 4:
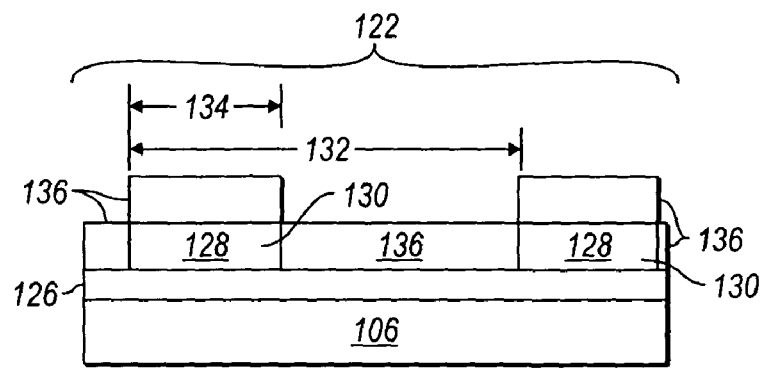
FIG. 4 illustrates yet another detailed view of a VCSEL grating.

Referring now to FIG. 4, an embodiment is illustrated where the grating 122 uses silicon, such as amorphous or polycrystalline silicon. In this example, silicon (Si) is used as the high index of refraction layer 128 on a lower index of refraction layer 126, which may be for example, $SiO_2$ or of $Si_3N_4$. Si has a much higher index of refraction than $Si_3N_4$. The index of refraction for Si may be 3.2 to 4.3 depending on deposition and wavelength. As such, Si gratings can be thinner than other types of gratings. Further, an increased difference in index of refraction by using silicon increases the reflective difference between the two competing polarizations. FIG. 4 further illustrates a using a $SiO_2$ overlay 136. The overlay 136 may be for example a 1/4λ. In the example shown, the Si high index of refraction layer 128 is 50 nm. The $SiO_2$ low index of refraction layer is 40 nm. The period 132 is 1 to 2 microns. And the duty cycle is 30%.

Embodiments described herein can be further optimized to promote single modedness of the VCSEL 100. When the grating 122 is former essentially circularly over the aperture 110, and when the grating layer 124 is at a thickness to act like an anti-reflective (AR) coating outside of the circular region of the grating 122, the fundamental mode is selected.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A vertical cavity surface emitting laser (VCSEL), the VCSEL comprising:
   an upper mirror;
   an active region coupled to the upper mirror, the active region having one or more quantum wells configured to generate light by stimulated emission;
   an aperture configured to direct a bias current through the active region;

a lower mirror coupled to the active region;
a light transmissive grating layer comprising:
  a low index of refraction layer formed by deposition on the upper mirror; and
  a high index of refraction layer formed by deposition on the low index of refraction layer, the high index of refraction having an index of refraction that is 0.3 or greater than the index of refraction for the low index of refraction layer; and
a grating formed into the grating layer above the aperture, the grating configured to pin polarization of light emitted from the active region.

2. The VCSEL of claim 1, wherein the low index of refraction layer and the high index of refraction layer are thin layers.

3. The VCSEL of claim 1, wherein the grating has a duty cycle less than about 50%.

4. The VCSEL of claim 1, wherein the low index of refraction layer acts as a stop-etch when forming the grating into the high index of refraction layer.

5. The VCSEL of claim 1, wherein the grating is formed into both the high index of refraction layer and the low index of refraction layer.

6. The VCSEL of claim 1, wherein at least a portion of the low index of refraction layer is not etched so as to provide passivation to the surface of the top mirror.

7. The VCSEL of claim 1, wherein the top mirror is a semiconductor mirror.

8. The VCSEL of claim 1, wherein the low index of refraction layer has an index of refraction between 1.2 and 2.5.

9. The VCSEL of claim 1, wherein the high index of refraction layer has an index of refraction between 1.8 and 5.

10. The VCSEL of claim 1, wherein the low index of refraction layer has an optical thickness of between 0.04 and 1.8 wave.

11. The VCSEL of claim 1, wherein the high index of refraction layer has an optical thickness of between 0.15 and 0.5 wave.

12. The VCSEL of claim 1, wherein the low index of refraction layer comprise $SiO_2$.

13. The VCSEL of claim 1, wherein the high index of refraction layer comprises at least one of Si and $Si_3N_4$.

14. The VCSEL of claim 1, wherein the grating layer is designed at a thickness to act as an anti reflective coating outside of a region comprising the grating.

15. A vertical cavity surface emitting laser (VCSEL), the VCSEL comprising:
  an upper mirror;
  an active region coupled to the upper mirror, the active region having one or more quantum wells configured to generate light by stimulated emission;
  an aperture configured to direct bias current through the active region;
  a lower mirror coupled to the active region;
  a light transmissive grating layer deposited on the upper mirror, the grating layer including a high index of refraction layer deposited on a low index of refraction material, the high index of refraction having an index of refraction that is 0.3 or greater than the index of refraction for the low index of refraction layer ; and
  a grating formed into the grating layer above the aperture, the grating layer having a duty cycle below 50% and configured to pin polarization of light emitted from the active region.

16. The VCSEL of claim 15, wherein the grating layer comprises a low index of refraction layer coupled to the upper mirror and a high index of refraction layer coupled to the low index of refraction layer.

17. The VCSEL of claim 16, wherein the low index of refraction layer and high index of refraction layer are thin layers.

18. The VCSEL of claim 1, wherein the deposited high index of refraction layer and/or the deposited low index of refraction layer is not a grown layer.

* * * * *